(12) United States Patent
Chen et al.

(10) Patent No.: US 11,955,428 B2
(45) Date of Patent: Apr. 9, 2024

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Hsin-Hung Chen, Tainan (TW); Min-Feng Kao, Chiayi (TW); Hsing-Chih Lin, Tainan (TW); Jen-Cheng Liu, Hsin-Chu (TW); Dun-Nian Yaung, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 257 days.

(21) Appl. No.: 17/169,445

(22) Filed: Feb. 6, 2021

(65) Prior Publication Data

US 2021/0159176 A1  May 27, 2021

Related U.S. Application Data

(60) Division of application No. 16/103,186, filed on Aug. 14, 2018, now Pat. No. 10,916,502, which is a continuation of application No. 15/259,992, filed on Sep. 8, 2016, now Pat. No. 10,049,981.

(51) Int. Cl.
| | |
|---|---|
| *H01L 23/528* | (2006.01) |
| *H01L 21/02* | (2006.01) |
| *H01L 21/306* | (2006.01) |
| *H01L 21/768* | (2006.01) |
| *H01L 23/48* | (2006.01) |
| *H01L 23/522* | (2006.01) |

(52) U.S. Cl.
CPC ...... *H01L 23/5283* (2013.01); *H01L 21/0228* (2013.01); *H01L 21/30604* (2013.01); *H01L 21/76831* (2013.01); *H01L 21/76877* (2013.01); *H01L 21/76898* (2013.01); *H01L 23/481* (2013.01); *H01L 23/5226* (2013.01)

(58) Field of Classification Search
CPC .............. H01L 23/481; H01L 23/5226; H01L 23/5283; H01L 21/76898; H01L 21/76831; H01L 21/0228; H01L 21/76877
See application file for complete search history.

(56) References Cited

U.S. PATENT DOCUMENTS

| | | | | |
|---|---|---|---|---|
| 8,076,234 | B1* | 12/2011 | Park | H01L 21/76801 438/622 |
| 2010/0133660 | A1* | 6/2010 | Huyghebaert | H01L 21/76802 257/E21.585 |
| 2014/0054774 | A1* | 2/2014 | Uchida | H01L 21/76898 438/653 |
| 2016/0293519 | A1* | 10/2016 | Gandhi | H01L 24/05 |
| 2020/0006128 | A1* | 1/2020 | Weng | H01L 23/5226 |
| 2021/0202309 | A1* | 7/2021 | Tsai | H01L 23/5226 |

* cited by examiner

*Primary Examiner* — Jaehwan Oh
*Assistant Examiner* — John M Parker
(74) *Attorney, Agent, or Firm* — WPAT LAW; Anthony King

(57) ABSTRACT

A semiconductor structure includes a substrate, a conductive via and a first insulation layer. The conductive via is through the substrate. The first insulation layer is between the substrate and the conductive via. A first surface of the first insulation layer facing the substrate and a second surface of the first insulation layer facing the conductive via are extended along different directions.

20 Claims, 14 Drawing Sheets

SEMICONDUCTOR STRUCTURE AND MANUFACTURING METHOD THEREOF

CROSS-REFERENCE TO RELATED APPLICATIONS

This application is a divisional application of U.S. patent application Ser. No. 16/103,186 filed on Aug. 14, 2018, entitled of "SEMICONDUCTOR DEVICE AND MANUFACTURING METHOD THEREOF", which is a continuation of application Ser. No. 15/259,992, filed on Sep. 8, 2016, the entire contents of all of which are hereby incorporated by reference.

BACKGROUND

Through silicon via (TSV) is one of the techniques for implementing three-dimensional (3D) package structure. For high-density package application, the dimension of TSV has shrank to micron or sub-micron level, and the aspect ratio of the through via is accordingly increased. The high aspect ratio of via hole, however, deteriorates step coverage of a sidewall insulation layer, thereby causing copper out-diffusing issue.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
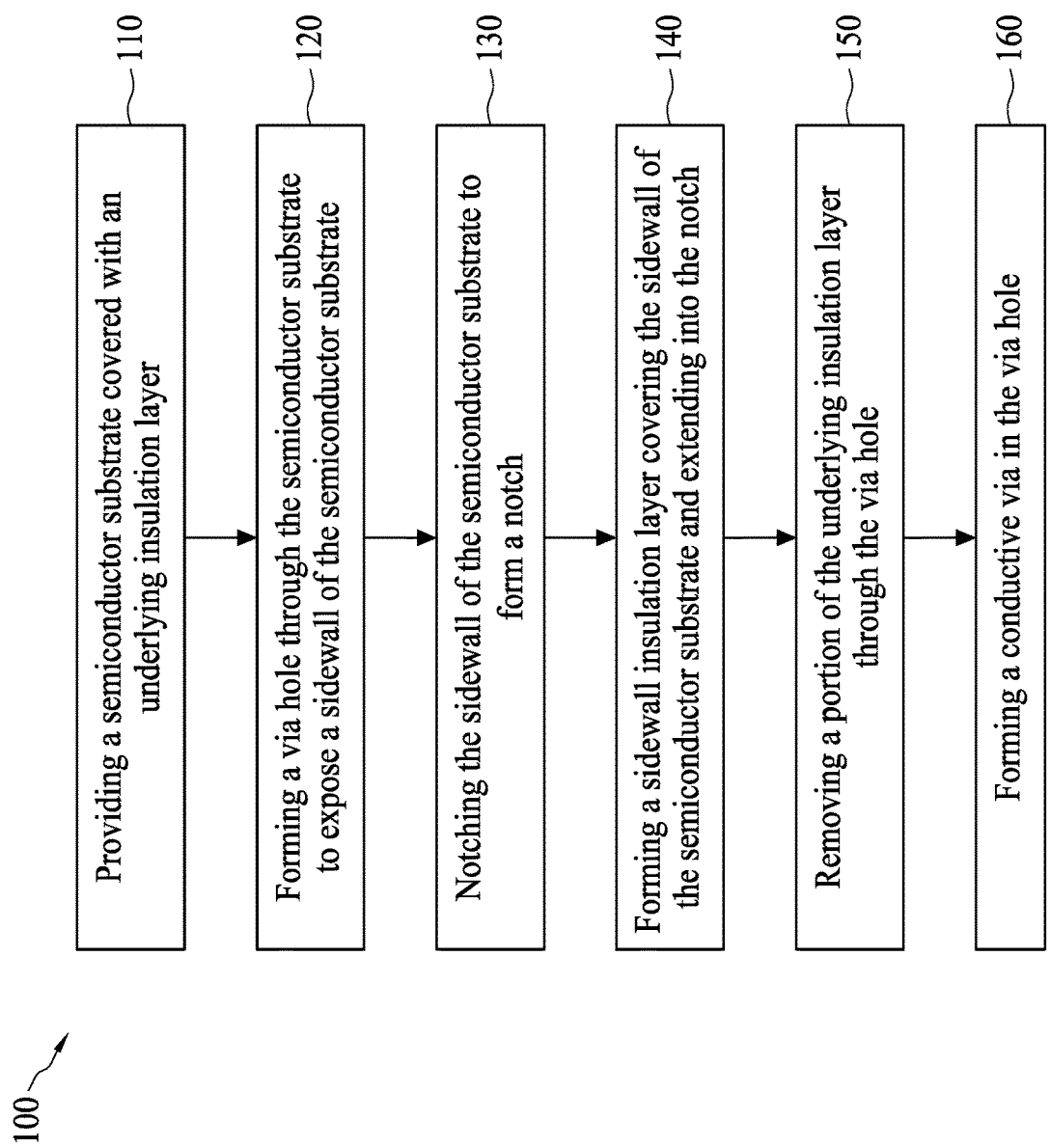
FIG. 1 is a flow chart illustrating a method for manufacturing a through via structure of a semiconductor device according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

As used herein, the term "through via structure" refers to a via structure having a via hole penetrating through at least one structural layer, and a conductive via in the via hole to electrically interconnect other electronic devices disposed on two opposite sides of the structural layer. In one or more embodiments, the through via structure is a through silicon via (TSV) structure in which the conductive via penetrates through a semiconductor substrate such as a silicon substrate.

In the present disclosure, a notch is formed from a sidewall of a via hole, and thus a sidewall insulation layer formed subsequently is filled into the notch, forming a protrusion with thicker thickness. The thick protrusion is configured as an etch barrier when etching an underlying insulation layer, and thus enhances insulation between the semiconductor substrate and a conductive via formed subsequently.

FIG. 1 is a flow chart illustrating a method for manufacturing a through via structure of a semiconductor device according to various aspects of the present disclosure. The method 100 begins with operation 110 in which a semiconductor substrate covered with an underlying insulation layer is provided. The method 100 continues with operation 120 in which a via hole through the semiconductor substrate is formed to expose a sidewall of the semiconductor substrate. The method 100 proceeds with operation 130 in which the semiconductor substrate is notched from the sidewall of the semiconductor substrate to form a notch. The method 100 proceeds with operation 140 in which a sidewall insulation layer is formed, covering the sidewall of the semiconductor substrate and extending into the notch. The method 100 continues with operation 150 in which a portion of the underlying insulation layer is removed through the via hole. The method 100 continues with operation 160 in which a conductive via is formed in the via hole.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
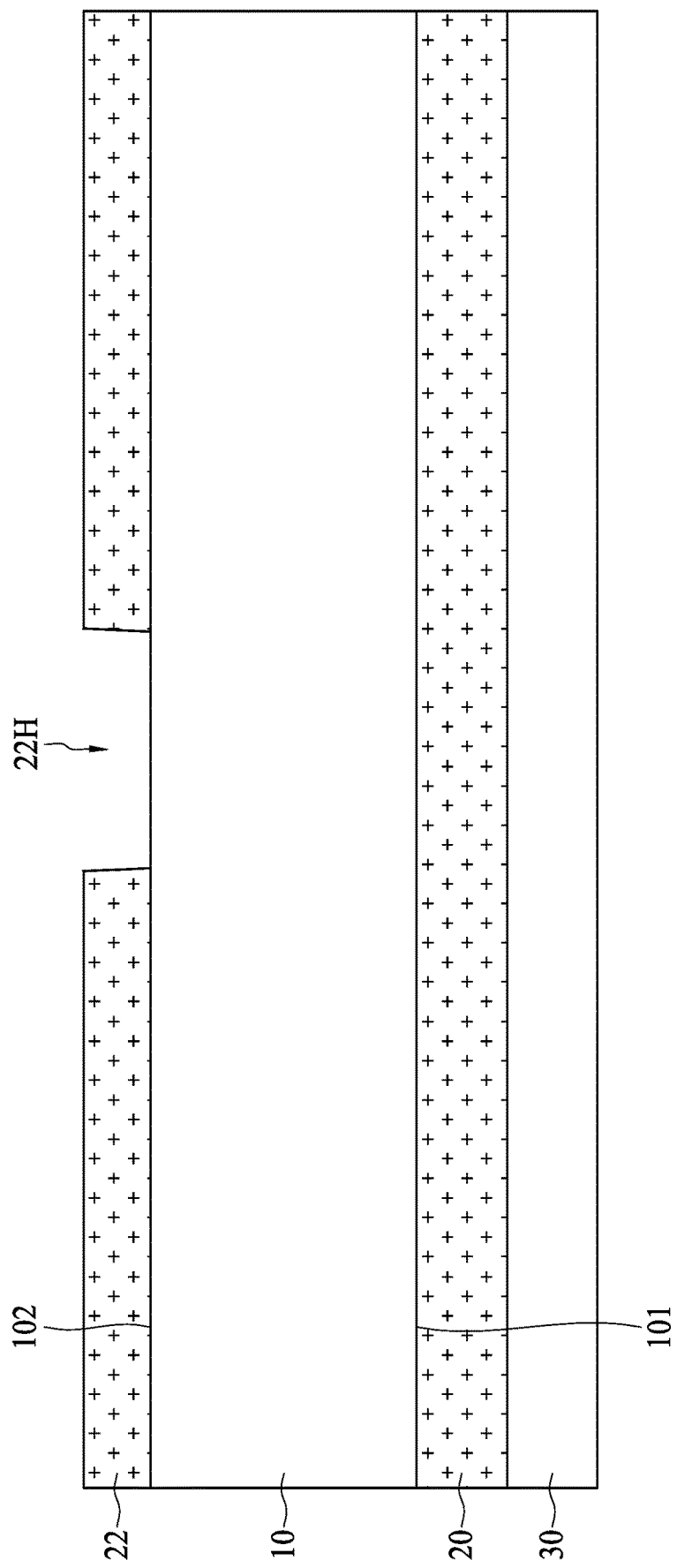
FIGS. 2A, 2B, 2C, 2D, 2E and 2F are cross-sectional views at one of various operations of manufacturing a through via structure of a semiconductor device according to one or more embodiments of the present disclosure.

FIGS. 2A, 2B, 2C, 2D, 2E and 2F are cross-sectional views at one of various operations of manufacturing a through via structure of a semiconductor device according to one or more embodiments of the present disclosure. As depicted in FIG. 2A and operation 110 in FIG. 1, a semiconductor substrate 10 covered with an underlying insulation layer 20 is provided. The semiconductor substrate 10 has a first surface 101 and a second surface 102 opposite to each other. The material of the semiconductor substrate 10 may comprise elementary semiconductor such as silicon or germanium; a compound semiconductor such as silicon germanium, silicon carbide, gallium arsenic, gallium phosphide, indium phosphide or indium arsenide; or combinations thereof. The underlying insulation layer 20 is formed over the first surface 101 of the semiconductor substrate 10. In one or more embodiments, the underlying insulation layer 20 may include, but is not limited to, an oxide layer such as a silicon oxide layer. In one or more embodiments, the semiconductor substrate 10 and the underlying insulation layer 20 are supported by a carrier substrate 30.

In one or more embodiments, an overlying insulation layer 22 is formed over the second surface 102 of the semiconductor substrate 10, The overlying insulation layer 22 has an opening 22H exposing a portion of the second surface 102 of the semiconductor substrate 10. The overlying insulation layer 22 is configured as a hard mask to define the location of via hole to be formed. In one or more embodiments, the overlying insulation layer 22 may include, but is not limited to, an oxide layer or a nitride layer.

Figure 2B:
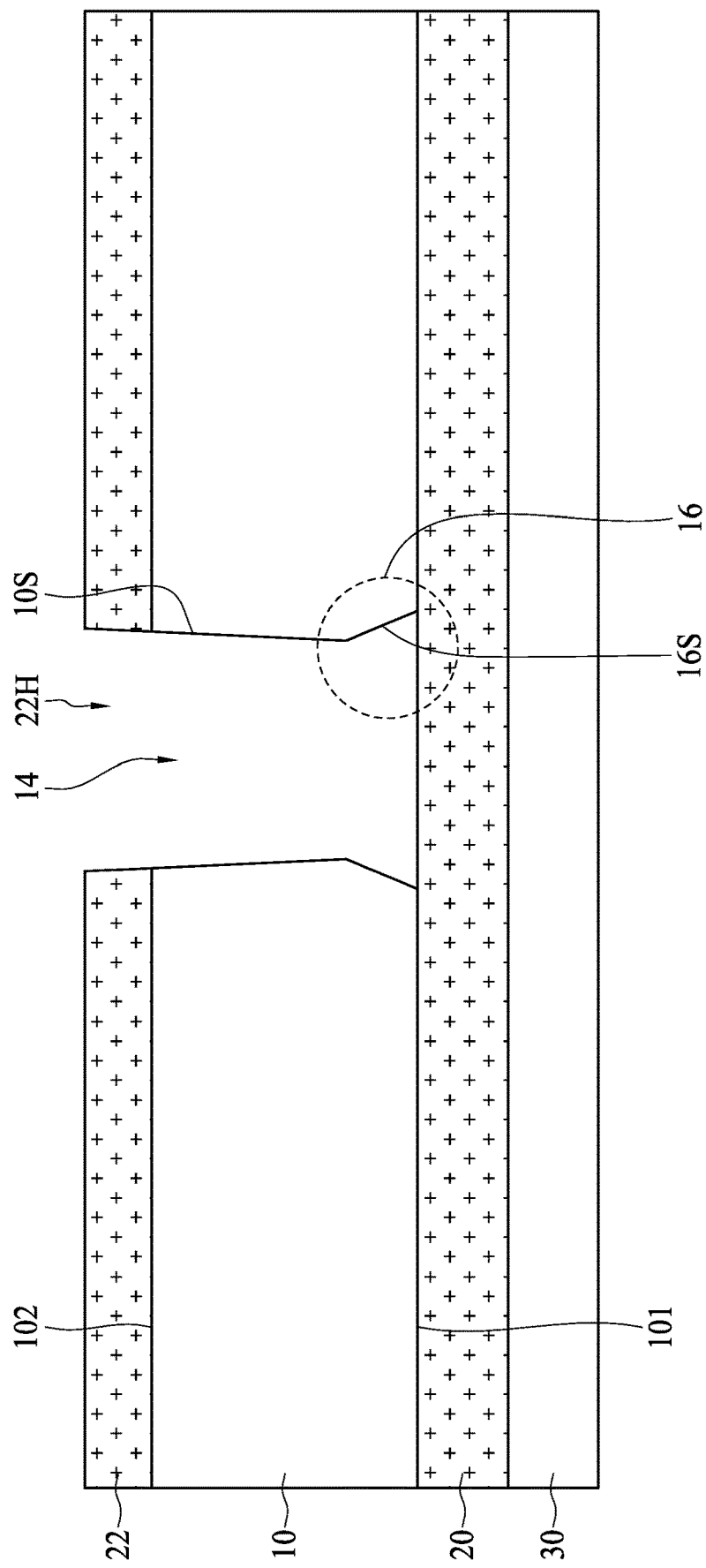

As depicted in FIG. 2B and operation 120 in FIG. 1, a via hole 14 through the semiconductor substrate 10 is formed to expose a sidewall 10S of the semiconductor substrate 10 and the underlying insulation layer 20. In one or more embodiments, the via hole 14 is formed by etching the semiconductor substrate 10 using the overlying insulation layer 22 as a hard mask and the underlying insulation layer 20 as an etch stop. In one or more embodiments, the via hole 14 is formed by anisotropic etching such as dry etching. In one or more embodiments, an aspect ratio of the via hole 14 is greater than 1.5, but not limited thereto. In some embodiments, the sidewall 10S of the semiconductor substrate 10 is substantially straight perpendicularly or inclined with respect to the first surface 101 of the semiconductor substrate 10. In one or more embodiments, the shape of the via hole 14 is substantially a circular shape or a polygonal shape when view from the top. As depicted in FIG. 2B and operation 130 in FIG. 1, a bottom portion of the semiconductor substrate 10 is notched outwardly from the sidewall 10S to form a notch 16 proximal to the interface between the semiconductor substrate 10 and the underlying insulation layer 20. In one or more embodiments, the notch 16 is notched in the semiconductor substrate 10 along a lateral direction substantially parallel to the first surface 101 and the second surface 102 of the semiconductor substrate 10. In one or more embodiments, the notch 16 includes a plane 16S facing the via hole 14.

In one or more embodiments, the etch rate of the semiconductor substrate 10 is higher than the etch rate of the underlying insulation layer 20 such that the semiconductor substrate 10 and the underlying insulation layer 20 have distinct etch selectivity. Accordingly, the semiconductor substrate 10 is etched to form the notch 16 in the interface between the semiconductor substrate 10 and the underlying insulation layer 20. In one or more embodiments, the depth of the notch 16 is substantially between 50 and 20000 angstroms, but not limited thereto. The formation of the via hole 14 and the notch 16 may be implemented in one-stage or multiple-stage etching.

Figure 2C:
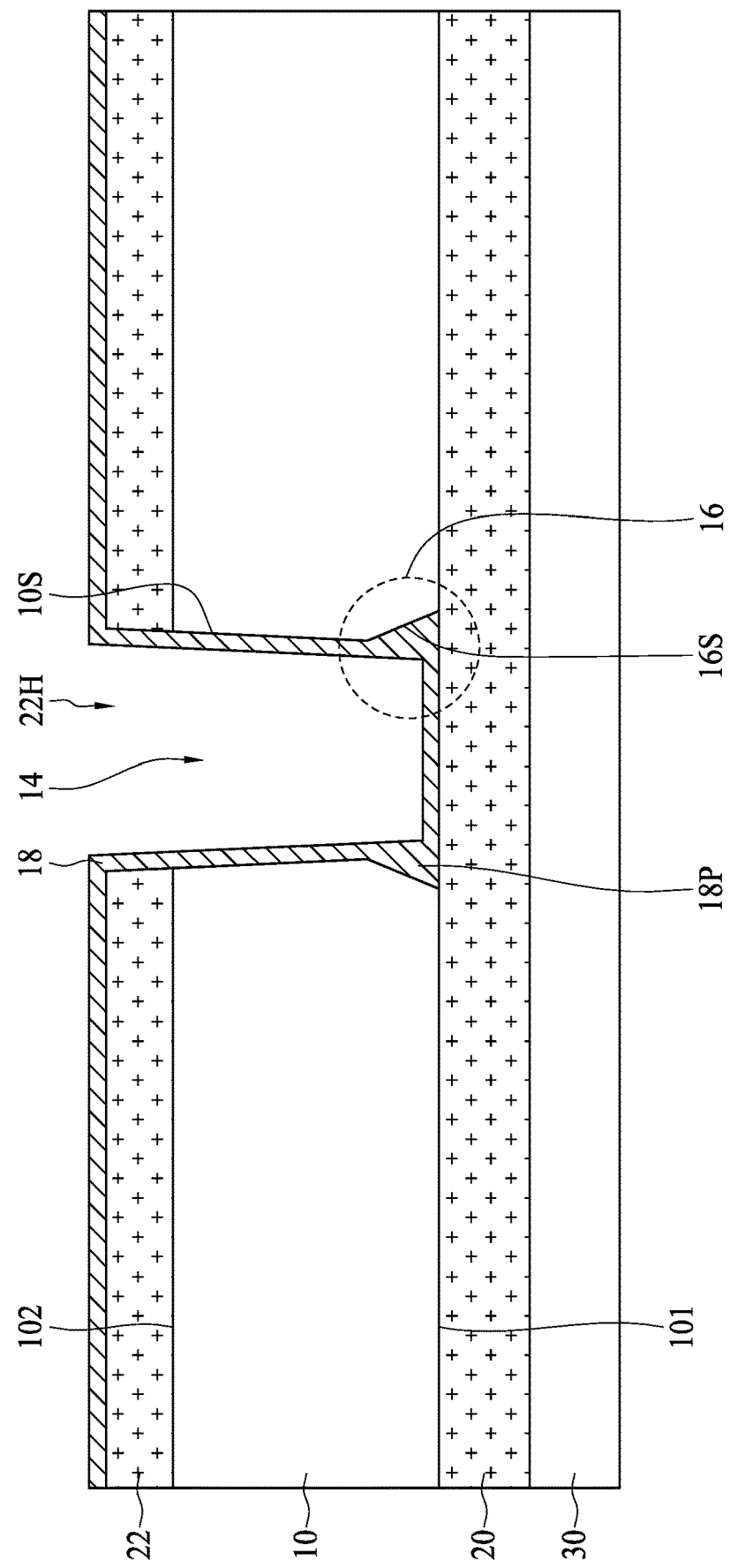
Figure 2D:
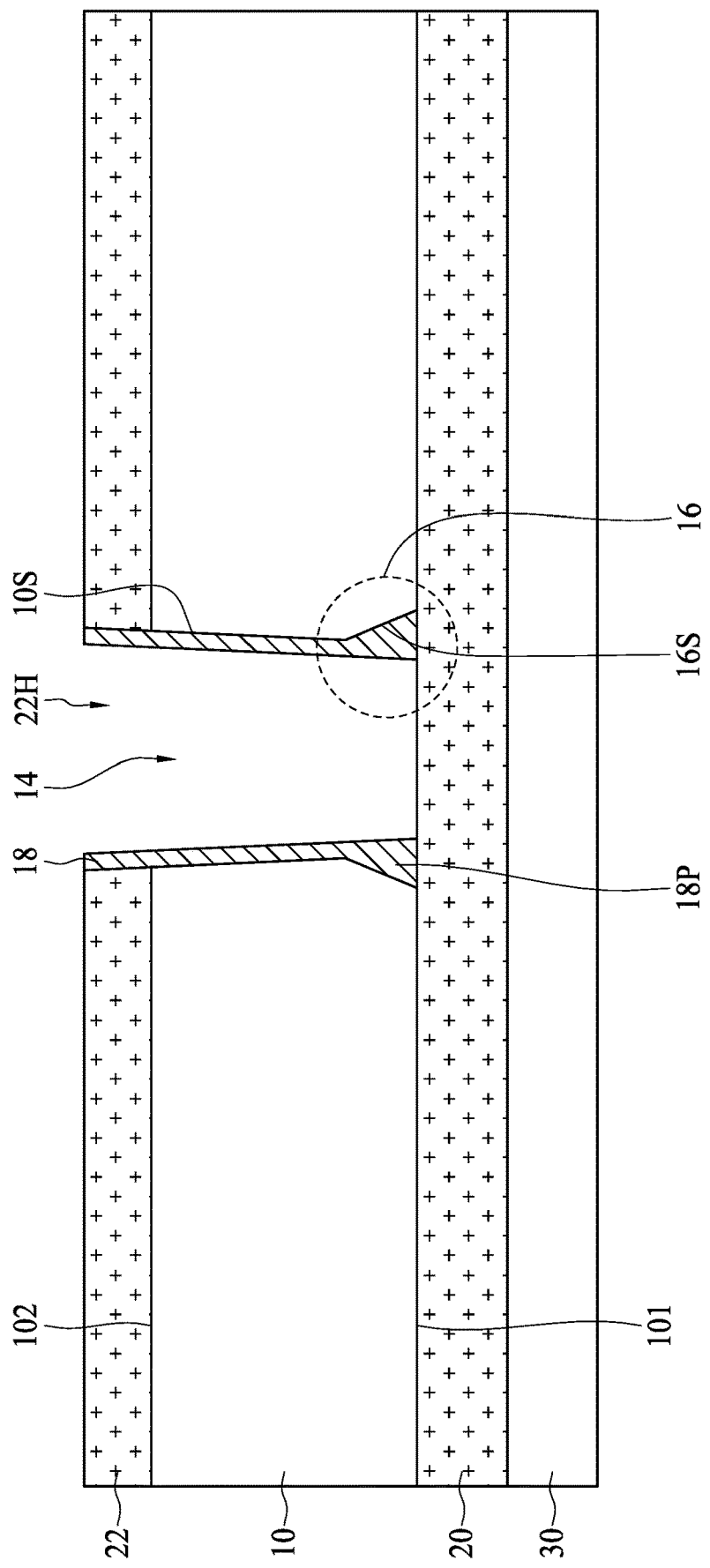

As depicted in FIG. 2C and operation 140 in FIG. 1, a sidewall insulation layer 18 covering the sidewall 10S of the semiconductor substrate 10 and extending into the notch 16 is formed. The sidewall insulation layer 18 includes a protrusion 18P proximal to the interface between the semiconductor substrate 10 and the underlying insulation layer 20, and protruding outwardly into the semiconductor substrate 10. In one or more embodiments, the thickness of the protrusion 18P is substantially between 50 and 20000 angstroms. In one or more embodiments, the sidewall insulation layer 18 includes, but is not limited to, an oxide liner layer such as a silicon oxide liner layer. In one or more embodiments, the sidewall insulation layer 18 is formed by atomic layer deposition (ALD) to fill the notch 16. In some alternative embodiments, the sidewall insulation layer 18 may also be formed by CVD, or other suitable advanced methods. In one or more embodiments, other structural layers such as a barrier layer, an adhesion layer, a passivation layer or a combination thereof may be formed on the sidewall 10S of the semiconductor substrate 10. As depicted in FIG. 2D, the sidewall insulation layer 18 disposed over the overlying insulation layer 22 and on the bottom of the via hole 14 is removed by, for example etching to expose the underlying insulation layer 20 through the via hole 14.

Figure 2E:
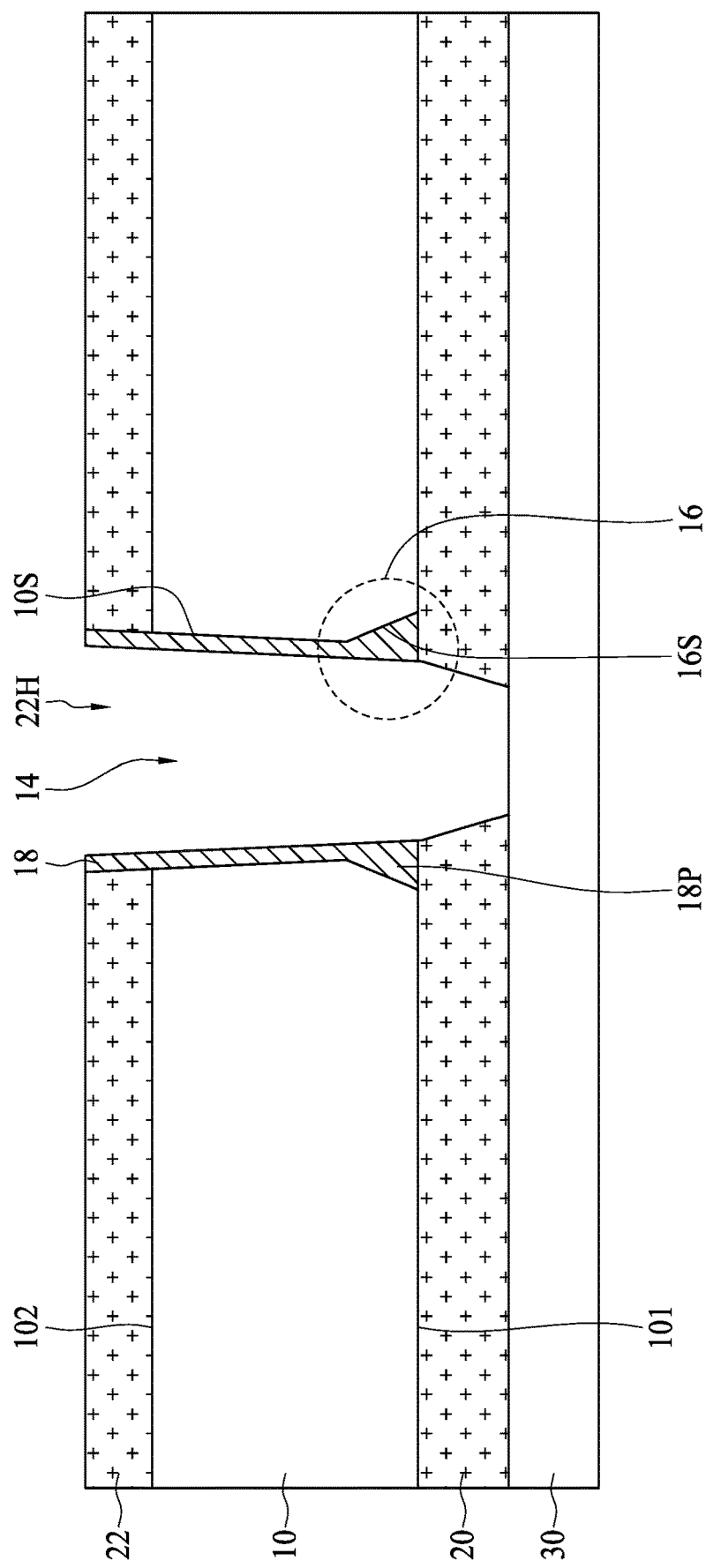

As depicted in FIG. 2E and operation 140 in FIG. 1, a portion of the underlying insulation layer 20 is removed through the via hole 14. In one or more embodiments, the underlying insulation layer 20 is removed by etching. During etching of the underlying insulation layer 20, the protrusion 18P in the notch 16 proximal to the interface between the semiconductor substrate 10 and the underlying insulation layer 20 is configured as an etching barrier, which prevents the semiconductor substrate 10 from being exposed. Accordingly, after the underlying insulation layer 20 is etched off through the via hole 14, the sidewall 10S of the semiconductor substrate 10 is still covered with and protected by the sidewall insulation layer 18.

Figure 2F:
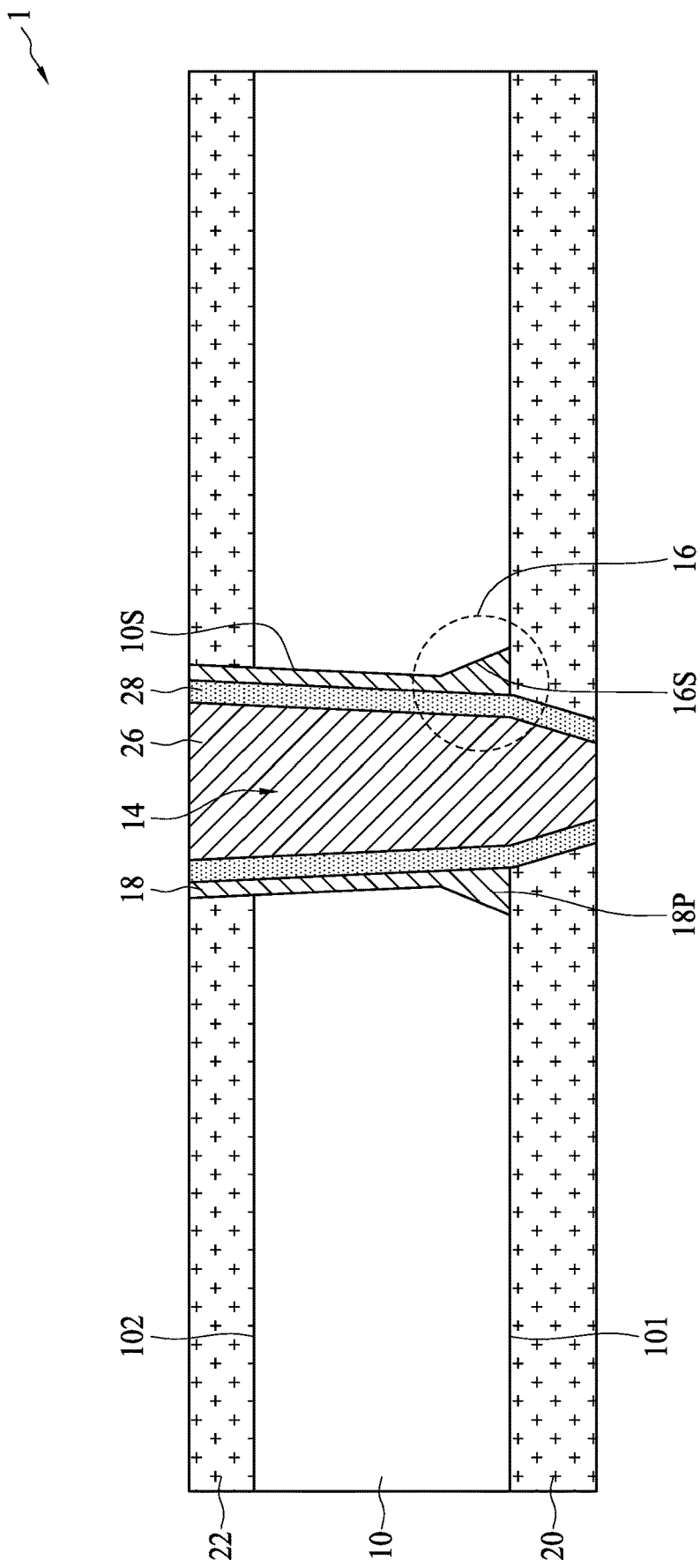

As depicted in FIG. 2F and operation 150 in FIG. 1, a conductive via 26 is formed in the via hole 14 to form a through via structure 1 of a semiconductor device. In one or more embodiments, the overlying insulation layer 22 is removed. In one or more embodiments, the carrier substrate 30 is removed. The material of the conductive via 26 may include, but is not limited to, metal such as copper, tungsten, other metals, or an alloy thereof. In one or more embodiments, the conductive via 26 is formed by electroplating, and a seed layer 28 is formed in the via hole 14 prior to the conductive via 26 is formed. In one or more embodiments, the aspect ratio of the through via structure 1 is greater than 1.5, but not limited thereto. In one or more embodiments, the through via structure 1 is configured as an interposer such as a silicon interposer in a three-dimensional package structure.

The sidewall insulation layer 18 is disposed between the semiconductor substrate 10 and the conductive via 26 with the protrusion 18P of the sidewall insulation layer 18 elongated into the semiconductor substrate 10, and therefore a thicker insulation is formed between the conductive via 26 and the semiconductor substrate 10. Accordingly, out-diffusion of the conductive via 26 is alleviated. The protrusion 18P is engaged with the notch 16 of the via hole 14, and thus the conductive via 26 is restricted from falling. Consequently, the reliability of the through via structure 1 is enhanced.

Figure 3:
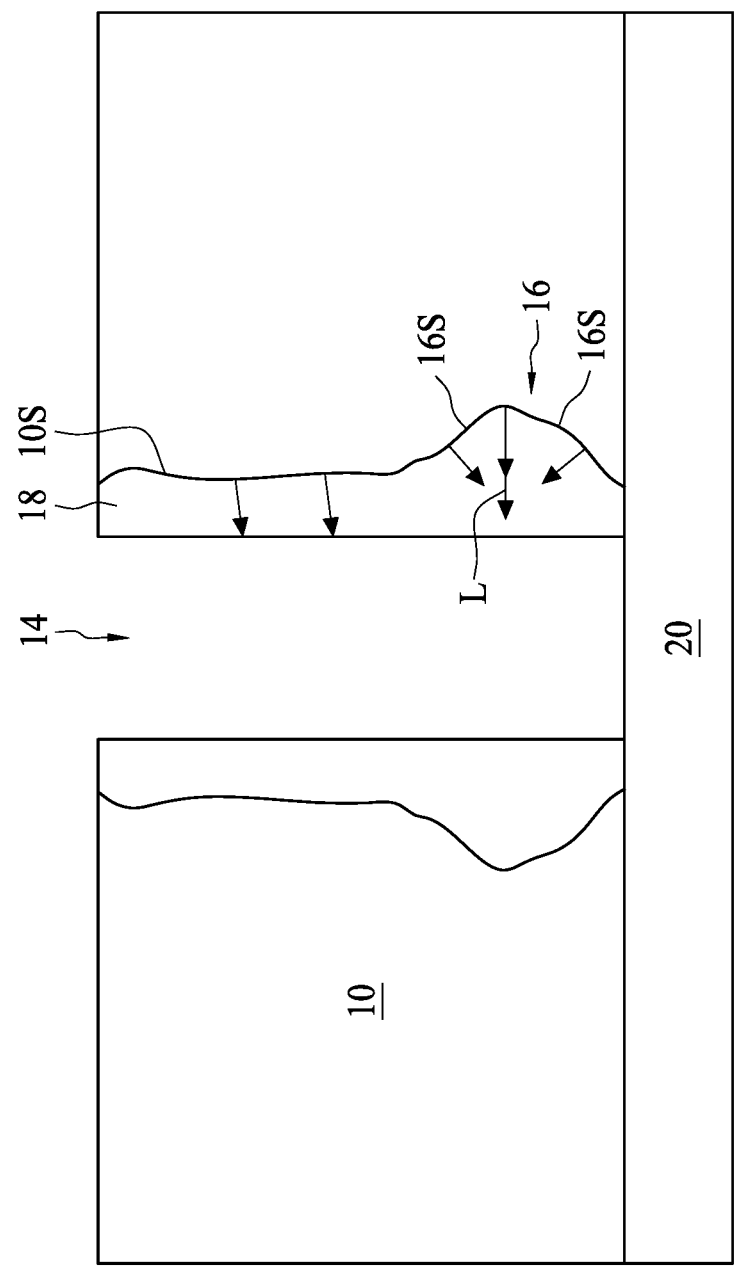
FIG. 3 is an enlarged diagram schematically illustrating a notch in accordance with one or more embodiments of the present disclosure.

Referring to FIG. 3, FIG. 3 is an enlarged diagram schematically illustrating a notch in accordance with one or more embodiments of the present disclosure. As illustrated in 3, the sidewall 10S of the semiconductor substrate 10 is etched to render the notch 16 have two or more planes 16S facing the via hole 14. The sidewall insulation layer 18 grows along directions L substantially perpendicular to the sidewall 10S of the semiconductor substrate 10 and the planes 16S of the notch 16, and the multi-plane profile increases the growth rate of the sidewall insulation layer 18 in the center region of the notch 16 than in the peripheral region. Thus, the notch 16 is able to be filled with sidewall insulation layer 18, In one or more embodiments, the protrusion 18 is in contact with the notched semiconductor substrate 10. Accordingly, the protrusion 18P in the notch 16 has one or more planes complementary to the one or more planes 16S of the notch 16.

The through via structure of the semiconductor device and manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4A:
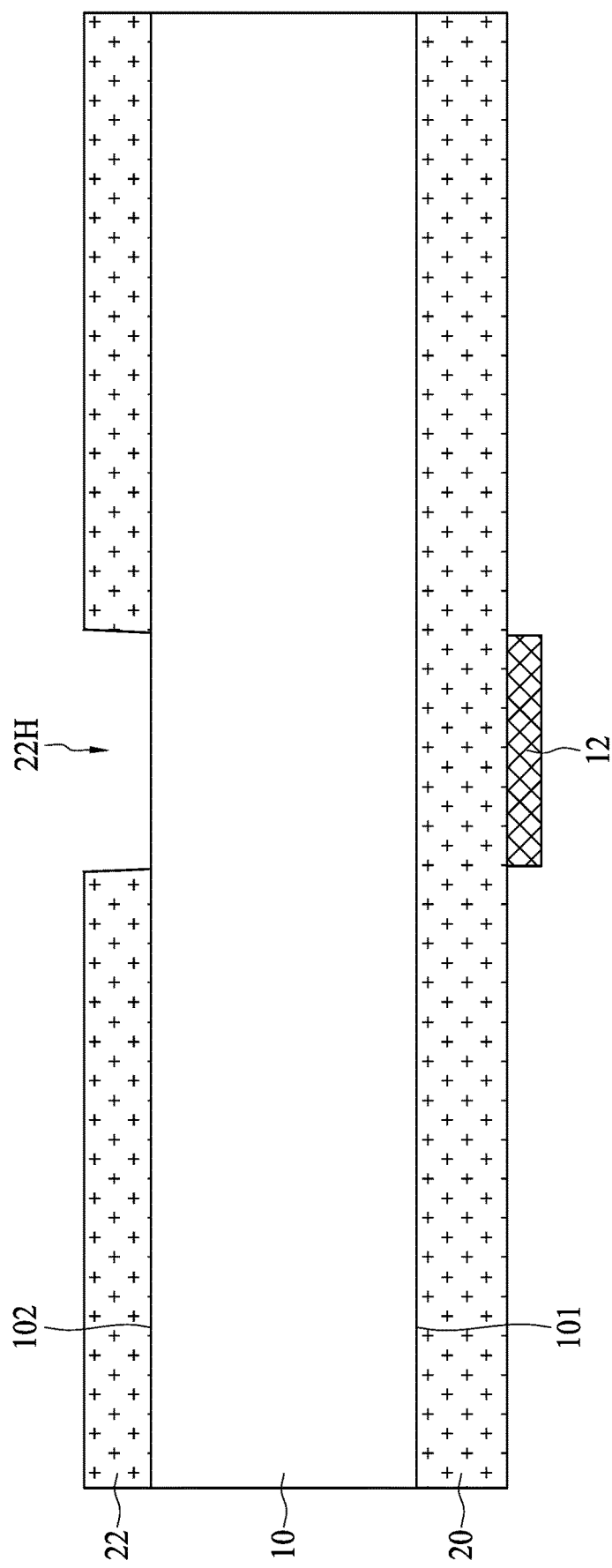
FIGS. 4A, 4B, 4C, 4D, 4E and 4F are cross-sectional views at one of various operations of manufacturing a through via structure of a semiconductor device according to one or more embodiments of the present disclosure.

FIGS. 4A, 4B, 4C, 4D, 4E and 4F are cross-sectional views at one of various operations of manufacturing a through via structure of a semiconductor device according to one or more embodiments of the present disclosure. As depicted in FIG. 4A, a semiconductor substrate 10 covered with an underlying insulation layer 20 is provided. The semiconductor substrate 10 has a first surface 101 and a second surface 102 opposite to each other. The material of the semiconductor substrate 10 may comprise elementary semiconductor such as silicon or germanium; a compound semiconductor such as silicon germanium, silicon carbide, gallium arsenic, gallium phosphide, indium phosphide or indium arsenide; or combinations thereof. The underlying insulation layer 20 is formed over the first surface 101 of the semiconductor substrate 10. In one or more embodiments, the underlying insulation layer 20 may include, but is not limited to, an oxide layer. In one or more embodiments, an electrode 12 is formed over the underlying insulation layer 20. The electrode 12 may be a contact terminal of conductive wiring such as redistribution layer, active device such as MOS transistor, passive device such as capacitor, or other devices already formed over the semiconductor substrate 10. In one or more embodiments, the underlying insulation layer 20 is an insulation layer such as a shallow trench insulator (STI), field oxide (FOX) or other insulator already formed over the semiconductor substrate 10.

In one or more embodiments, an overlying insulation layer 22 is formed over the second surface 102 of the semiconductor substrate 10. The overlying insulation layer 22 has an opening 22H exposing a portion of the second surface 102 of the semiconductor substrate 10. The overlying insulation layer 22 is configured as a hard mask to define the location of via hole to be formed. The overlying insulation layer 22 may include, but is not limited to, an oxide layer or a nitride layer.

Figure 4B:
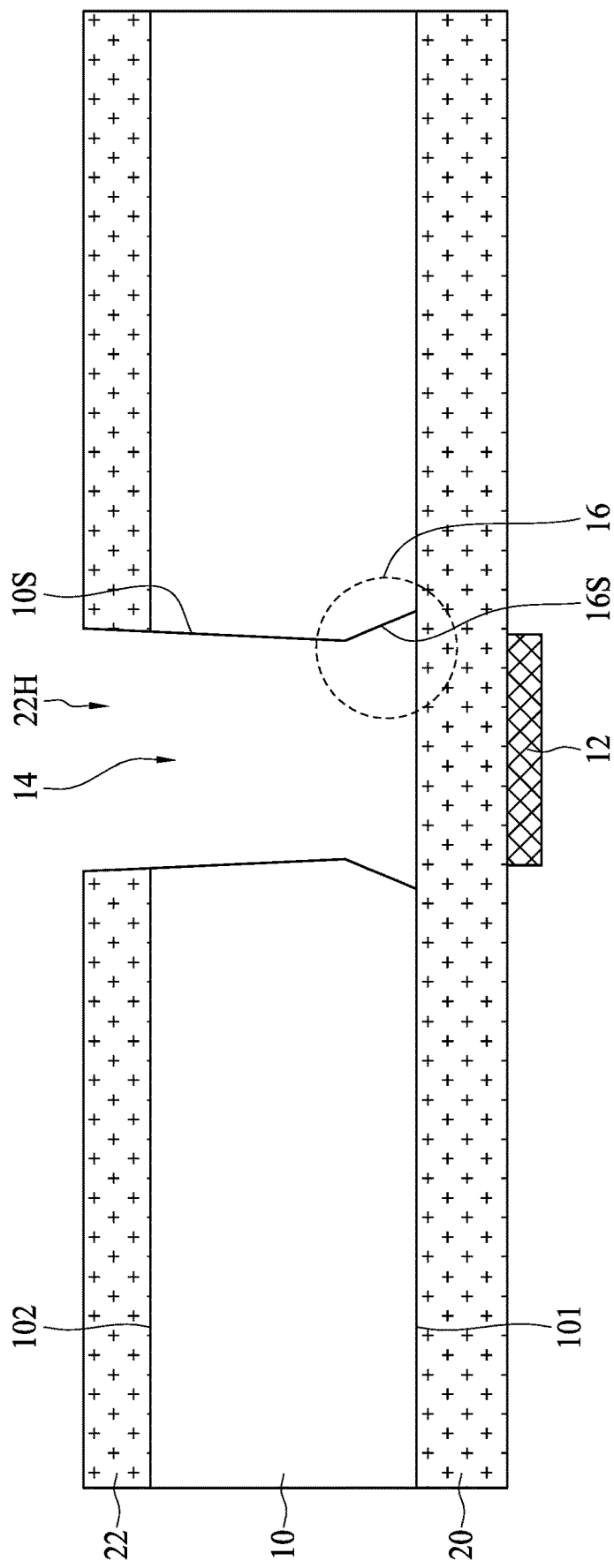

As depicted in FIG. 4B, a via hole 14 through the semiconductor substrate 10 is formed to expose a sidewall 10S of the semiconductor substrate 10 and the underlying insulation layer 20. In one or more embodiments, the via hole 14 is formed by etching the semiconductor substrate 10 using the overlying insulation layer 22 as a hard mask and the underlying insulation layer 20 as an etch stop. In one or more embodiments, the via hole 14 is formed by anisotropic etching such as dry etching. The semiconductor substrate 10 is notched outwardly from the side wall 10S to form a notch 16 proximal to the interface between the semiconductor substrate 10 and the underlying insulation layer 20. In one or more embodiments, the notch 16 is notched in the semiconductor substrate 10 along a lateral direction substantially parallel to the first surface 101 and the second surface 102 of the semiconductor substrate 10. In one or more embodiments, the notch 16 includes one or more planes 16S facing the via hole 14.

In one or more embodiments, the etch rate of the semiconductor substrate 10 is higher than the etch rate of the underlying insulation layer 20 such that the semiconductor substrate 10 and the underlying insulation layer 20 have distinct etch selectivity. Accordingly, the semiconductor substrate 10 is etched to form the notch 16 in the interface between the semiconductor substrate 10 and the underlying insulation layer 20. In one or more embodiments, the depth of the notch 16 is substantially between 50 and 20000 angstroms, but not limited thereto. The formation of the via hole 14 and the notch 16 may be implemented in one-stage or multiple-stage etching.

Figure 4C:
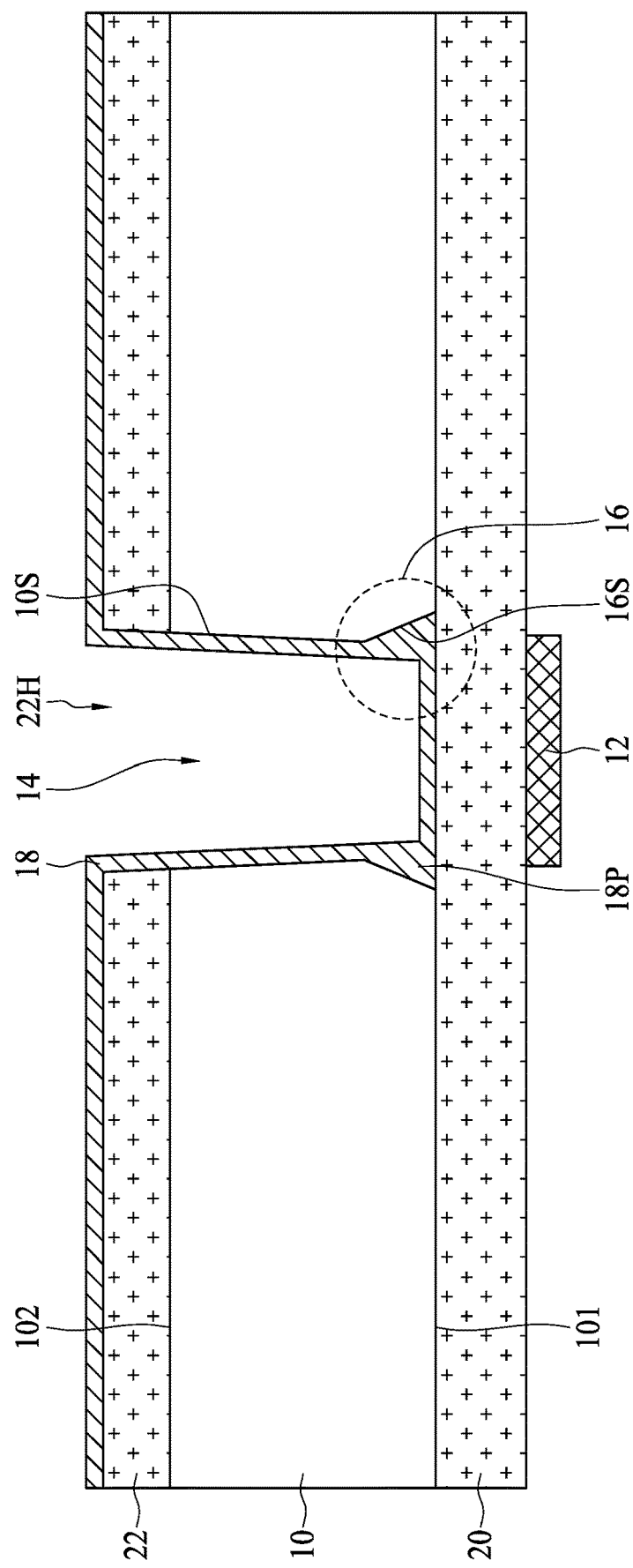
Figure 4D:
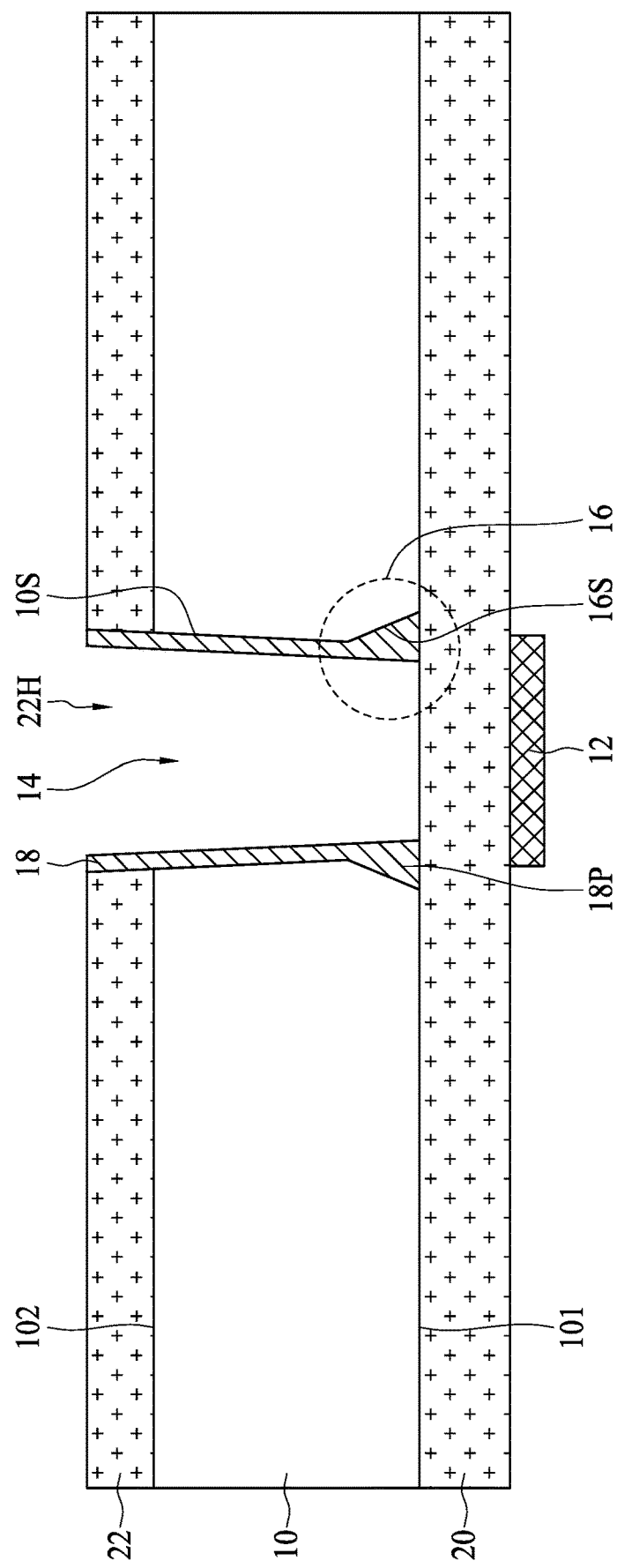

As depicted in FIG. 4C, a sidewall insulation layer 18 covering the sidewall 10S of the semiconductor substrate 10 and extending into the notch 16 is formed. The sidewall insulation layer 18 includes a protrusion 18P proximal to the interface between the semiconductor substrate 10 and the underlying insulation layer 20, and protruding outwardly into the semiconductor substrate 10. In one or more embodiments, the thickness of the protrusion 18P is substantially between 50 and 20000 angstroms. In one or more embodiments, the sidewall insulation layer 18 includes, but is not limited to, an oxide liner layer. In one or more embodiments, the sidewall insulation layer 18 is formed by atomic layer deposition OLD) to fill the notch 16. In some alternative embodiments, the sidewall insulation layer 18 may also be formed by CVD, or other suitable advanced methods. In one or more embodiments, other structural layers such as a barrier layer, an adhesion layer, a passivation layer or a combination thereof may be formed on the sidewall 10S of the semiconductor substrate 10. As depicted in FIG. 31), the sidewall insulation layer 18 over the overlying insulation layer 22 and on the bottom of the via hole 14 is removed by, for example etching to expose the underlying insulation layer 20 through the via hole 14.

Figure 4E:
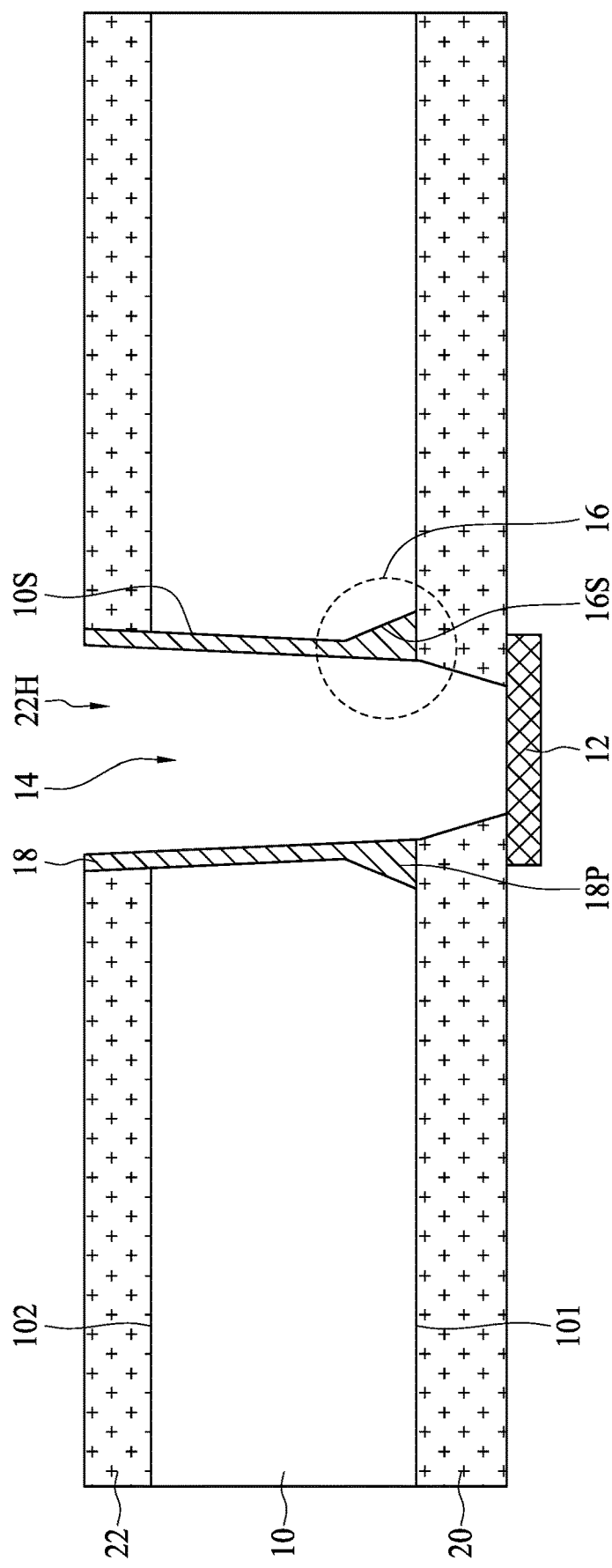

As depicted in FIG. 4E, a portion of the underlying insulation layer 20 is removed through the via hole 14. In one or more embodiments, the underlying insulation layer 20 is removed by etching. During etching of the underlying insulation layer 20, the protrusion 18P in the notch 16 proximal to the interface between the semiconductor substrate 10 and the underlying insulation layer 20 is configured to prevent the semiconductor substrate 10 from being exposed. Accordingly, after the underlying insulation layer 20 is etched off through the via hole 14, the sidewall 10S of the semiconductor substrate 10 is still covered with and protected by the sidewall insulation layer 18.

Figure 4F:
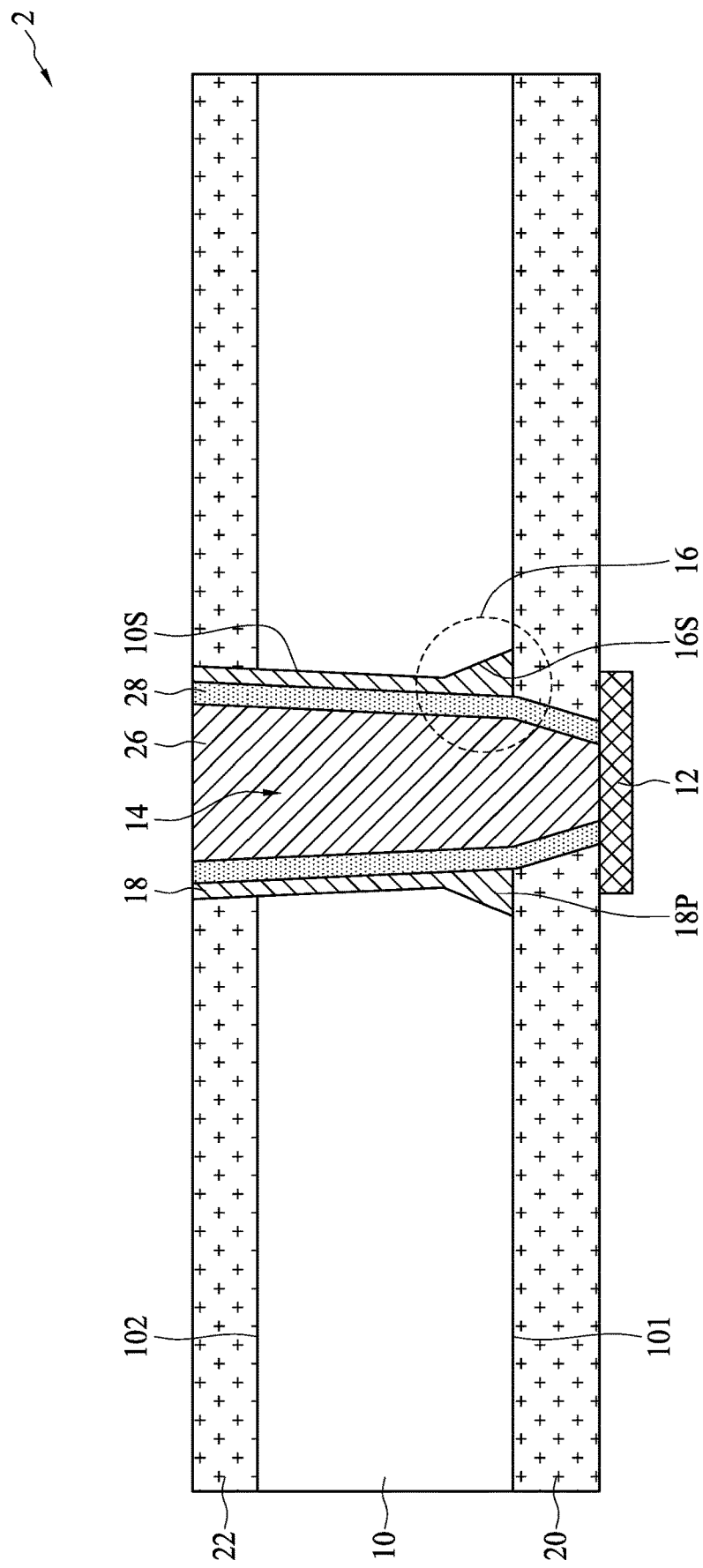

As depicted in FIG. 4F, a conductive via 26 is formed in the via hole 14 to form a through via structure 2 of a semiconductor device. The material of the conductive via 26 may include, but is not limited to, metal such as copper, tungsten, other metals, or an alloy thereof. In one or more embodiments, the conductive via 26 is formed by electroplating, and a seed layer 28 such as a titanium nitride layer or a tantalum nitride layer is formed in the via hole 14 prior to the conductive via 26 is formed. In one or more embodiments, the aspect ratio of the through via structure 2 is greater than 1.5, but not limited thereto. In one or more embodiments, the through via structure 2 is configured to electrically connected to other electronic device(s) such as chip(s) or circuit board(s) through either one end or both ends of the conductive via 26 to implement a 3D package structure. The protrusion 18P of the sidewall insulation layer 18 is elongated into the semiconductor substrate 10, and therefore a thicker insulation is formed between the conductive via 26 and the semiconductor substrate 10. Accordingly, out-diffusion of the conductive via 26 is alleviated. The protrusion 18P is engaged with the notch 16 of the via hole 14, and thus the conductive via 26 is restricted from falling. Consequently, the reliability of the through via structure 2 is enhanced.

The through via structure of a semiconductor structure of the present disclosure includes a sidewall insulation layer between the semiconductor substrate and the conductive via with a protrusion engaged with a notch formed in the semiconductor substrate proximal to the bottom of the via hole. The protrusion of the sidewall insulation layer provides a barrier between the conductive via and the semiconductor substrate, and thus out-diffusion of the conductive via alleviated.

In one exemplary aspect, a semiconductor structure includes a substrate, a conductive via and a first insulation layer. The conductive via is through the substrate. The first insulation layer is between the substrate and the conductive via. A first surface of the first insulation layer facing the substrate and a second surface of the first insulation layer facing the conductive via are extended along different directions.

In another exemplary aspect, a semiconductor structure includes a substrate, a conductive via and a first insulation layer. The substrate has a first surface and a second surface opposite to each other. The conductive via is through the substrate. The first insulation layer is between the substrate and the conductive via. A thickness of the first insulation layer varies along a direction substantially perpendicular to the first surface.

In yet another aspect, a method for manufacturing a semiconductor device includes providing a semiconductor substrate covered with an underlying insulation layer, forming a via hole through the semiconductor substrate to expose a sidewall of the semiconductor substrate, and notching the sidewall of the semiconductor substrate to form a notch. The method further includes forming a sidewall insulation layer covering the sidewall of the semiconductor substrate and extending into the notch, removing a portion of the underlying insulation layer through the via hole, and forming a conductive via in the via hole.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate having a first surface and a second surface opposite to the first surface;
   a conductive via through the substrate;
   a first insulation layer between the substrate and the conductive via, wherein a first surface of the first insulation layer facing the substrate and a second surface of the first insulation layer facing the conductive via are extended along different directions;
   a seed layer between the first insulation layer and the conductive via, wherein the first insulation layer is entirely separated from the conductive via by the seed layer; and
   a second insulation layer over the second surface of the substrate, wherein a topmost surface of the first insulation layer, a top surface of the second insulation layer and a top surface of the conductive via are aligned with each other,
   wherein the first insulation layer has a bottom surface aligned with the first surface of the substrate, and a width of the bottom surface of the first insulation layer is greater than a width of the topmost surface of the first insulation layer.

2. The semiconductor structure of claim 1, further comprising:
   a third insulation layer under the first surface of the substrate and the first insulation layer, wherein the first insulation layer exposes the third insulation layer from a top view perspective.

3. The semiconductor structure of claim 2, wherein the first insulation layer includes a vertex disposed between the third insulation layer and the substrate.

4. The semiconductor structure of claim 3, wherein the bottom surface of the first insulation layer is in contact with the third insulation layer, and the bottom surface of the first insulation layer and the first surface of the first insulation layer are in contact to form the vertex.

5. The semiconductor structure of claim 1, wherein the first insulation layer includes a protrusion and a thickness of the protrusion is substantially between 50 and 20000 angstroms.

6. The semiconductor structure of claim 1, wherein an aspect ratio of the conductive via is greater than 1.5.

7. The semiconductor structure of claim 1, wherein the first surface of the first insulation layer facing the substrate has a plurality of slopes.

8. A semiconductor structure, comprising:
   a substrate having a first surface and a second surface opposite to each other;
   a conductive via through the substrate;
   a first insulation layer between the substrate and the conductive via, wherein a thickness of the first insulation layer varies along a direction substantially perpendicular to the first surface;
   a seed layer between the first insulation layer and the conductive via, wherein the first insulation layer is entirely separated from the conductive via by the seed layer; and
   a second insulation layer over the second surface of the substrate, wherein a topmost surface of the first insulation layer, a top surface of the second insulation layer and a top surface of the conductive via are aligned with each other,
   wherein the first insulation layer has a bottom surface aligned with the first surface of the substrate, and a width of the bottom surface of the first insulation layer is greater than a width of the topmost surface of the first insulation layer.

9. The semiconductor structure of claim 8, wherein the thickness of the first insulation layer increases along the direction from the second surface to the first surface.

10. The semiconductor structure of claim 8, further comprising:
a third insulation layer under the first surface of the substrate and the first insulation layer, wherein the first insulation layer exposes the third insulation layer from a top view perspective.

11. The semiconductor structure of claim 10, wherein the conductive via is through the second insulation layer and the third insulation layer.

12. The semiconductor structure of claim 8, wherein the first insulation layer adjacent to the first surface of the substrate includes one or more planes.

13. The semiconductor structure of claim 8, wherein the thickness of the first insulation layer adjacent to the first surface of the substrate is substantially between 50 and 20000 angstroms.

14. The semiconductor structure of claim 8, wherein the first insulation layer comprises an oxide liner layer.

15. A semiconductor structure, comprising:
a substrate having a first surface, a second surface opposite to the first surface, and a first sidewall coupling the first surface and the second surface;
a first insulation layer under the first surface of the substrate;
a conductive via through the substrate and the first insulation layer;
a second insulation layer between the substrate and the conductive via, wherein the first sidewall of the substrate contacts the second insulation layer, and the second insulation layer is disposed over a top surface of the first insulation layer; and
a third insulation layer over the second surface of the substrate, wherein a topmost surface of the second insulation layer, a top surface of the third insulation layer and a top surface of the conductive via are aligned with each other,
wherein the second insulation layer comprises a bottom surface aligned with the first surface of the substrate, and a width of the bottom surface of the second insulation layer is greater than a width of the topmost surface of the second insulation layer.

16. The semiconductor structure of claim 15, wherein a second sidewall of the first insulation layer is substantially free of the second insulation layer.

17. The semiconductor structure of claim 15, wherein the second insulation layer stops at an interface between the substrate and the first insulation layer.

18. The semiconductor structure of claim 15, further comprising a seed layer between the second insulation layer and the conductive via.

19. The semiconductor structure of claim 18, wherein the second insulation layer stops at an interface between the seed layer and the first insulation layer.

20. The semiconductor structure of claim 18, wherein the second insulation layer is entirely separated from the conductive via by the seed layer.

* * * * *